(12) United States Patent
Muchherla et al.

(10) Patent No.: US 12,001,721 B2
(45) Date of Patent: Jun. 4, 2024

(54) MULTIPLE-PASS PROGRAMMING OF MEMORY CELLS USING TEMPORARY PARITY GENERATION

(71) Applicant: Micron Technology, Inc., Boise, ID (US)

(72) Inventors: Kishore Kumar Muchherla, Fremont, CA (US); Lakshmi Kalpana Vakati, San Jose, CA (US); Dave Scott Ebsen, Minnetonka, MN (US); Peter Feeley, Boise, ID (US); Sanjay Subbarao, Irvine, CA (US); Vivek Shivhare, Milpitas, CA (US); Jiangli Zhu, San Jose, CA (US); Fangfang Zhu, San Jose, CA (US); Akira Goda, Tokyo (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 20 days.

(21) Appl. No.: 17/882,355

(22) Filed: Aug. 5, 2022

(65) Prior Publication Data
US 2024/0045616 A1 Feb. 8, 2024

(51) Int. Cl.
*G06F 3/06* (2006.01)

(52) U.S. Cl.
CPC .......... *G06F 3/0659* (2013.01); *G06F 3/0619* (2013.01); *G06F 3/064* (2013.01); *G06F 3/0656* (2013.01); *G06F 3/0683* (2013.01)

(58) Field of Classification Search
CPC ...... G06F 3/0659; G06F 3/0619; G06F 3/064; G06F 3/0656; G06F 3/0683
See application file for complete search history.

(56) References Cited

U.S. PATENT DOCUMENTS

| | | | |
|---|---|---|---|
| 2021/0081276 A1* | 3/2021 | Suzuki | G06F 3/0619 |
| 2022/0291838 A1* | 9/2022 | Gorobets | G06F 11/108 |
| 2023/0214291 A1* | 7/2023 | Muthiah | G06F 3/0656 |
| | | | 714/764 |

* cited by examiner

*Primary Examiner* — Edward J Dudek, Jr.
(74) *Attorney, Agent, or Firm* — NICHOLSON DE VOS WEBSTER & ELLIOTT LLP

(57) ABSTRACT

Methods, systems, and apparatuses include receiving a write command including user data. The write command is directed to a portion of memory including a first and second block and a first and second user data portion are directed to the first and second block. Temporary parity data is generated using the first and second user data portions. The temporary parity data and the first and second user data portions are stored in a buffer. Portions of the first and second block are programmed with two programming passes. The first and second user data portions in the buffer are invalidated in response to a completion of the second programming pass of the portions of the first and second blocks. The temporary parity data is maintained in the buffer until a second programming pass of the first and second block.

20 Claims, 10 Drawing Sheets

MULTIPLE-PASS PROGRAMMING OF MEMORY CELLS USING TEMPORARY PARITY GENERATION

TECHNICAL FIELD

The present disclosure generally relates to writing data to a memory device in multiple passes, and more specifically, relates to multiple-pass programming of memory cells using temporary parity data.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
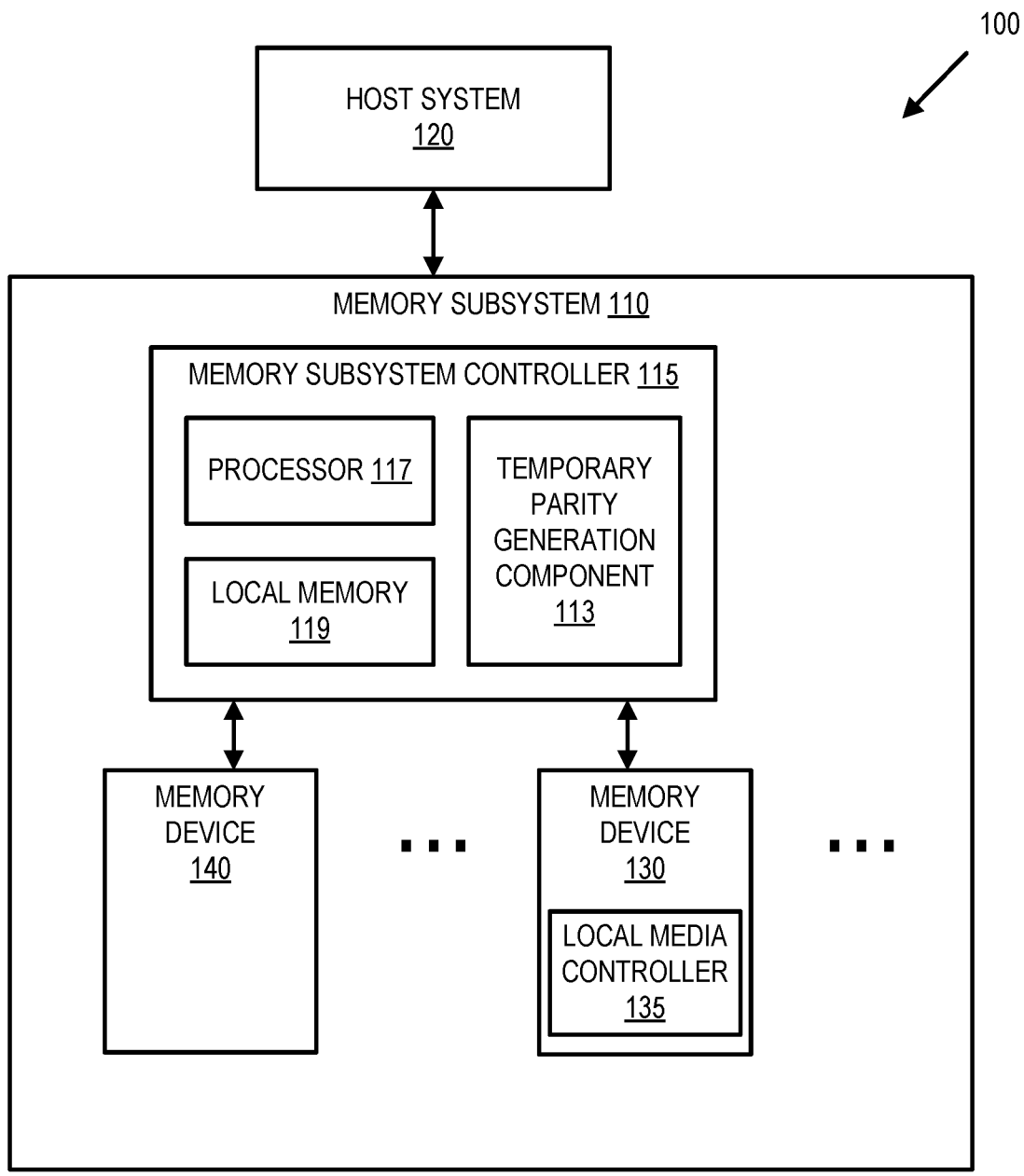
FIG. 1 illustrates an example computing system that includes a memory subsystem in accordance with some embodiments of the present disclosure.

Aspects of the present disclosure are directed to programming memory cells in multiple passes using temporary parity generation in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

In conventional memory systems, there are defects introduced during manufacturing and during operation that may prevent a memory block from being properly programmed. When attempting to program a memory block containing defects, user data being written to the memory block can be lost when the programming fails. In order to preserve data, the user data being programmed into the memory block is held in a buffer until successfully programmed. Additionally, when programming multiple memory blocks and avoiding a delay between programming the memory blocks (e.g., beginning the programming of the next memory block while a data integrity of scan checks the current memory block), an additional buffer is used to store the beginning of the next block when the current block is not yet finished. For example, a buffer of ten SLC blocks can be used when programming successive sets of two QLC blocks (eight SLC blocks to cover the current set of two QLC blocks and two SLC blocks for beginning of the next set of two QLCs block) to ensure no data loss due to defects. If there is not full coverage of the memory block to be programmed, a defect in the memory block could cause programming failure and an increase in uncorrectable bit error rate (UBER). For a QLC block that does not include defects, however, a buffer of four SLC blocks is excessive. There is, therefore, a tradeoff between UBER and the overprovisioning penalty of providing full buffer coverage of the memory block and concurrent buffer coverage of successive memory blocks.

Aspects of the present disclosure address the above and other deficiencies by buffering a combination of user data and temporary parity data in place of at least a portion of the user data. The temporary parity data takes up less space than the user data and allows the user data to be cleared from the buffer sooner, thereby requiring fewer buffer blocks. Because there are fewer buffer blocks required, the use of temporary parity data reduces the overprovisioning penalty. Additionally, there is not an increase in UBER that would typically accompany a smaller buffer size because data loss is only a risk when the errors exceed the error correction capability of the temporary parity data.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a temporary parity generation component 113 that can generate temporary parity data during multiple-pass programming. In some embodiments, the controller 115 includes at least a portion of the temporary parity generation component 113. For example, the controller 115 can include a processor 117 (processing device) configured to execute instructions stored in local memory 119 for performing the operations described herein. In some embodiments, a temporary parity generation component 113 is part of the host system 120, an application, or an operating system.

The temporary parity generation component 113 can generate temporary parity data while programming memory blocks and can invalidate the user data in the buffer to keep the buffer available for the programming of subsequent memory blocks. Further details with regards to the operations of the temporary parity generation component 113 are described below.

Figure 2:
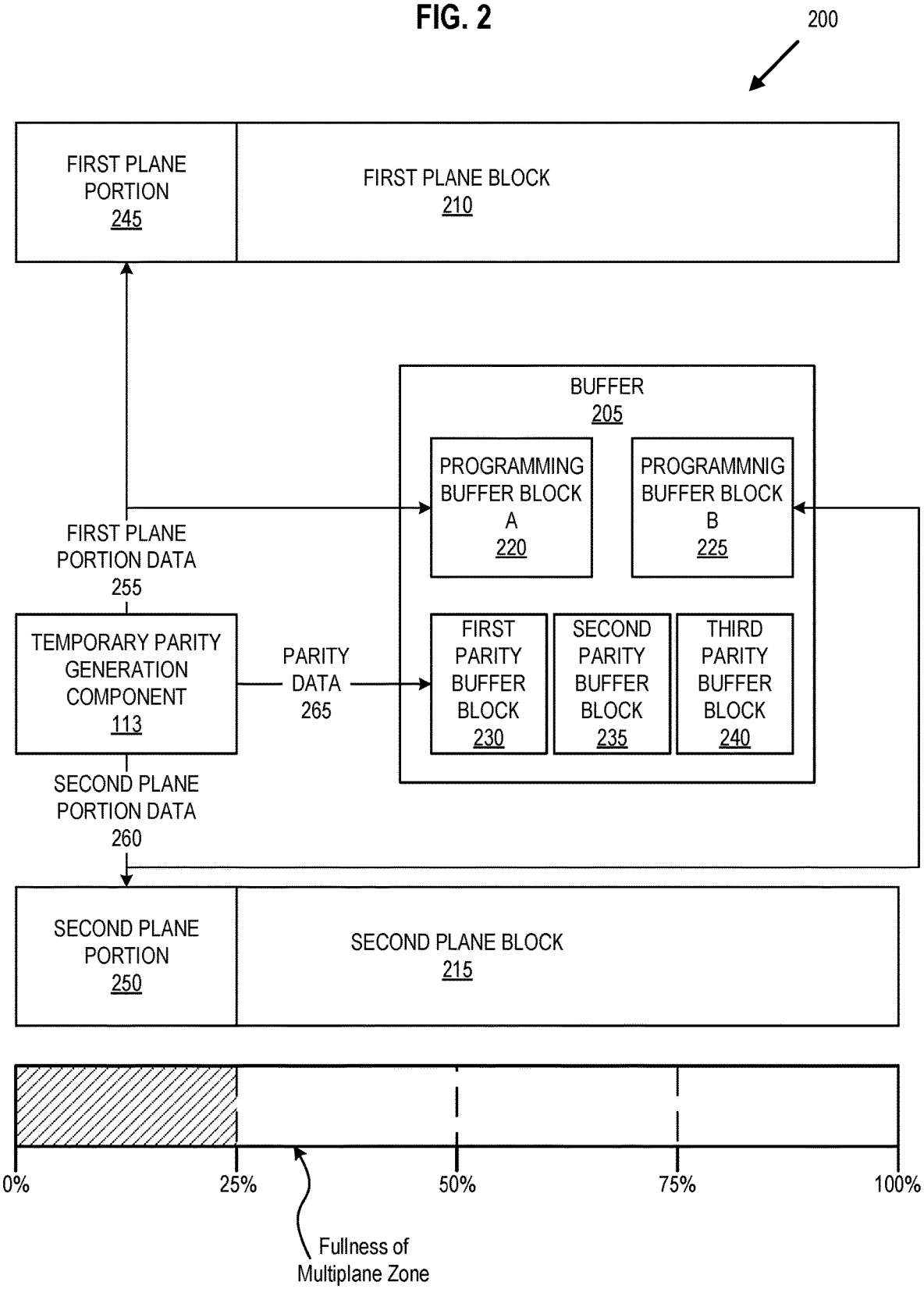
FIG. 2 is a block diagram of an example multiple-pass programming system using temporary parity generation in accordance with some embodiments of the present disclosure.

FIG. 2 is a block diagram of an example multiple-pass programming system 200 using temporary parity generation that includes a temporary parity generation component 113. The multiple-pass programming system 200 includes buffer 205, first plane block 210, and second plane block 215. In some embodiments, first plane block 210 and second plane block 215 are not composed of decks and the blocks are therefore the smallest independently erasable subdivision. Buffer 205 contains multiple blocks including programming buffer block A 220, programming buffer block B 225, first parity buffer block 230, second parity buffer block 235, and third parity buffer block 240. First plane block 210 has subdivisions including first plane portion 245 and second plane block 215 has subdivisions including second plane portion 250.

In some embodiments, buffer 205 and its components programming buffer block A 220, programming buffer block B 225, first parity buffer block 230, second parity buffer block 235, and third parity buffer block 240, are part of a local memory of a memory subsystem, such as local memory 119 of FIG. 1, or memory device 130 of FIG. 1. In other embodiments, although illustrated separately, buffer 205 and its components programming buffer block A 220, programming buffer block B 225, first parity buffer block 230, second parity buffer block 235, and third parity buffer block 240, are all parts of temporary parity generation component 113.

First plane block 210 and second plane block 215 are blocks on different planes of a memory die. For example, in some embodiments, first plane block 210 and second plane block 215 and their respective subdivisions, first plane portion 245 and second plane portion 250, are part of a memory device, such as memory device 130 of FIG. 1. The memory device is composed of one or more dies, each of which is in turn composed of at least two planes. Throughout this disclosure, a die is defined as a unit of the memory device that independently executes commands and reports status and planes are defined as subdivisions of a die which can concurrently execute commands. Therefore, as illustrated in FIG. 2, temporary parity generation component 113 can concurrently program both second plane portion 250 and first plane portion 245. Likewise, each plane is composed of one or more blocks, each of which is in turn composed of one or more pages or wordlines. In some embodiments, each block is composed of one or more decks each of which is in turn composed of one or more pages or wordlines. In embodiments without deck subdivisions, a block represents the smallest unit that can be erased, while in embodiments including deck subdivisions, a deck represents the smallest unit that can be erased. In some embodiments, a page or wordline represents the smallest programmable unit of memory.

First plane block 210 and second plane block 215 (and therefore their components including first plane portion 245 and second plane portion 250) are composed of QLCs. First plane portion 245 and second plane portion 250 are each one quarter of their respective plane blocks, holding an equivalent amount of data of an SLC block. Programming buffer block A 220, programming buffer block B 225 buffer the data held in first plane portion 245 and second plane portion 250 and therefore also hold a quarter of a QLC, the equivalent amount of data of an SLC block and are composed of SLCs. Similarly, first parity buffer block 230, second parity buffer block 235, and third parity buffer block 240 buffer parity information of the user data held in first plane portion 245 and second plane portion 250 and are also composed of SLCs. First parity buffer block 230, second parity buffer block 235, and third parity buffer block 240 hold an equivalent amount of data as each of first plane portion 245 and second plane portion 250.

In some embodiments, however, first plane block 210 and second plane block 215 are composed of another cell type, such as MLCs or TLCs, the number of portions for each of the plane blocks therefore varies based on the cell type. For example, when first plane block 210 and second plane block 215 are composed of a TLC, there are three plane portions. Likewise, when first plane block 210 and second plane block 215 is composed of an MLC, there are two plane portions. In these embodiments, Programming buffer block A 220, programming buffer block B 225, first parity buffer block 230, second parity buffer block 235, and third parity buffer block 240 are composed of SLCs and hold an equivalent amount of data as each of the plane portions. The number of parity blocks depends on the number of subdivisions of first plane block 210 and second plane block 215. For n number of subdivisions, there are n−1 parity blocks. For example, when there are four subdivisions of first plane block 210 and second plane block 215, there are three parity blocks, first parity buffer block 230, second parity buffer block 235, and third parity buffer block 240.

In some embodiments, temporary parity generation component 113 receives a write command from a host device, such as host system 120 of FIG. 1 with user data including first plane portion data 255 and second plane portion data 260. In such embodiments, the write command also includes a logical address, which when translated to a physical address, represents first plane block 210 and second plane block 215.

Temporary parity generation component 113 programs first plane portion 245 with first plane portion data 255 and programs second plane portion 250 with second plane portion data 260. Temporary parity generation component 113 also programs programming buffer block A 220 with first plane portion data 255 and programs programming buffer block B 225 with second plane portion data 260. In some embodiments, temporary parity generation component 113 programs first plane portion 245, second plane portion 250, programming buffer block A 220, and programming buffer block B 225 concurrently.

In some embodiments, temporary parity generation component 113 programs first plane block 210 and second plane block 215 and therefore their components including first plane portion 245 and second plane portion 250 in multiple passes. For example, temporary parity generation component 113 may program first plane portion 245 and second plane portion 250 in two passes, the first pass referred to as a coarse programming pass and the second pass referred to as a fine programming pass. The coarse programming pass does not contain all the information required to read the user data and the user data is therefore replicated elsewhere until the fine programming pass is completed (such as in programming buffer block A 220, programming buffer block B 225). In contrast, after temporary parity generation component 113 conducts a fine programming pass of the user data in first plane portion 245 and second plane portion 250, the copy of the user data stored in programming buffer block A 220 and programming buffer block B 225 is no longer needed to provide a readable copy for the fine programming pass.

Temporary parity generation component 113 also generates parity data 265 using an exclusive-or operation on first plane portion data 255 and second plane portion data 260. In some embodiments, temporary parity generation component 113 uses an operation other than exclusive-or (e.g., another error correction scheme) to generate parity data 265. In some embodiments, temporary parity generation component 113 programs programming buffer block A 220 and programming buffer block B 225 with first plane portion data 255 and second plane portion data 260 respectively while generating parity data 265 and programming parity data 265 into first parity buffer block 230. For example, temporary parity generation component 113 concurrently programs a wordline of the pair of first plane block 210 and programming buffer block A 220 and the pair of second plane block 215 and programming buffer block B 225. While the user data from programming the wordline is still stored temporary parity generation component 113 also generates parity data on the two wordlines of user data and stores the resulting wordline of parity data in first parity buffer block 230.

In embodiments where adaptive buffer allocation component 113 uses multiple pass programming to program first plane portion 245 and second plane portion 250, programming buffer block A 220 and programming buffer block B 225 serve the dual functions of (1) protecting against programming block failure of first plane block 210 and second plane block 215 and (2) providing a readable copy of the user data during the coarse programming pass. First parity buffer block 230, however, partially protects against programming failure of first plane block 210 and second plane block 215. For example, first plane portion 245 and second plane portion 250 are subject to multiple pass programming but programming buffer block A 220, programming buffer block B 225, and first parity buffer block 230 are not. Therefore, temporary parity generation component 113 programs the user data into first plane portion 245 and second plane portion 250 with a coarse programming pass while storing first plane portion data 255 and second plane portion data 260 in programming buffer block A 220 and programming buffer block B 225 in a readable state. Temporary parity generation component 113 also generates parity data 265 from first plane portion data 255 and second plane portion data 260 and stores parity data 265 in first parity buffer block 230.

In response to fully programming (i.e., finishing the fine programming pass for) first plane portion 245 and second plane portion 250, temporary parity generation component 113 invalidates or erases programming buffer block A 220 and programming buffer block B 225. Programming buffer block A 220 and programming buffer block B 225 therefore provide a readable copy of the user data during the coarse programming pass of first plane portion 245 and second plane portion 250 but do not protect the contents of first plane portion 245 and second plane portion 250 against programming block failure once programming buffer block A 220 and programming buffer block B 225 are erased. As the multiplane zone is only at 25% of being fully programmed, data can still be lost due to programming block failure of first plane block 210 or second plane block 215. First parity buffer block 230, however, contains parity data for first plane portion 245 and second plane portion 250 after programming buffer block A 220 and programming buffer block B 225 are erased and can be used to recover the data in the event of a programming block failure, reducing the likelihood of an increase in LIBER due to invalidating or erasing programming buffer block A 220 and programming buffer block B 225.

Figure 3:
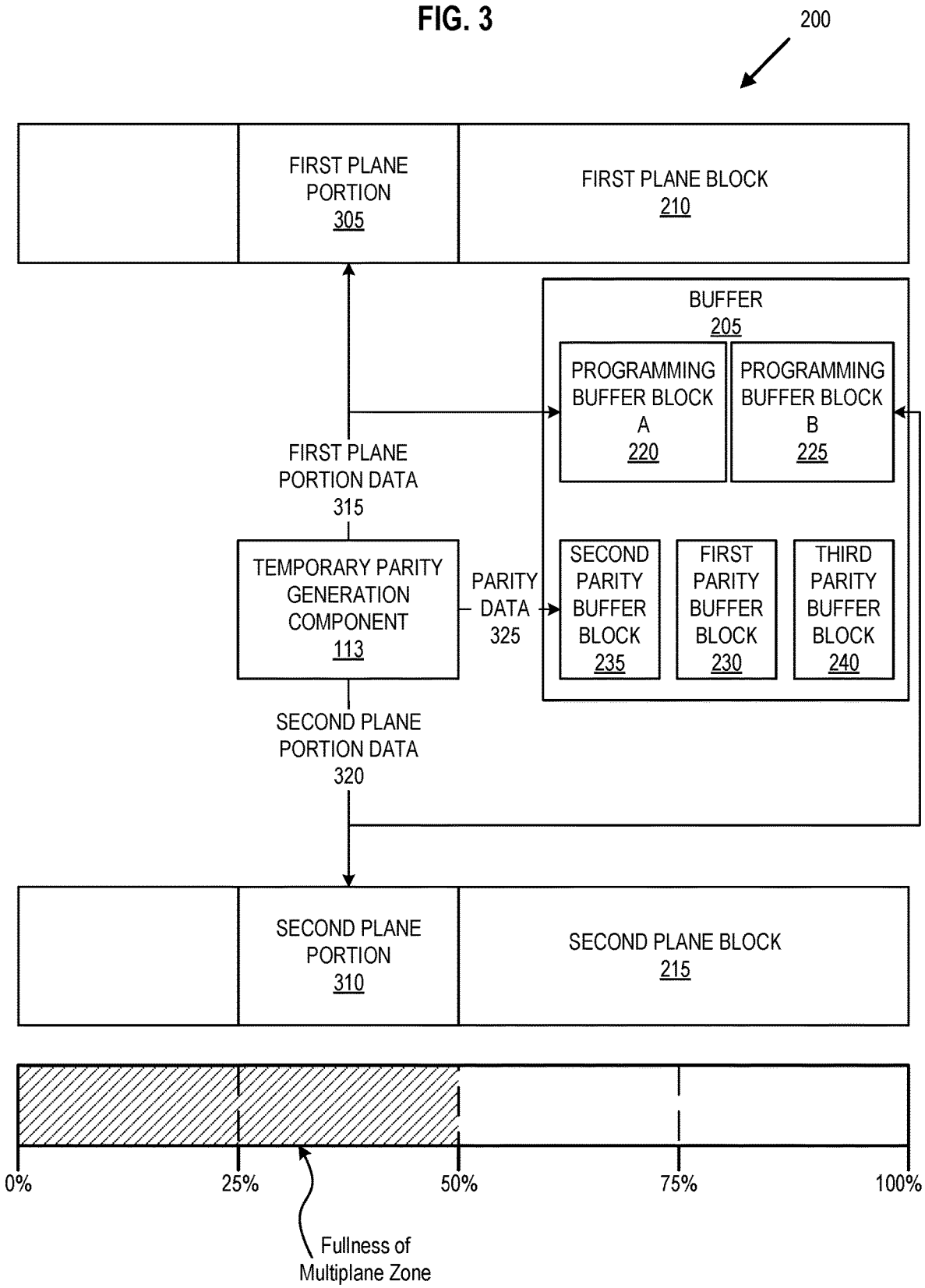
FIG. 3 is another block diagram of an example multiple-pass programming multiple-pass system using temporary parity generation in accordance with some embodiments of the present disclosure.

FIG. 3 is another block diagram of an example multiple-pass programming system 200 using temporary parity generation that includes a temporary parity generation component 113. First plane block 210 has subdivisions including first plane portion 305 and second plane block 215 has subdivisions including second plane portion 310.

In some embodiments, temporary parity generation component 113 receives a write command from a host device, such as host system 120 of FIG. 1 with user data including first plane portion data 315 and second plane portion data 320. For example, the user data can be a part of the write command that provided data for first plane portion data 255 and second plane portion data 260 as described above.

Temporary parity generation component 113 programs first plane portion 305 with first plane portion data 315 and programs second plane portion 310 with second plane portion data 320. Temporary parity generation component 113 also programs programming buffer block A 220 with first plane portion data 315 and programs programming buffer block B 225 with second plane portion data 320. First plane portion data 315 and second plane portion data 320 replace the buffered data from the previous portions held in programming buffer block A 220 and programming buffer block B 225. In some embodiments, temporary parity generation component 113 programs first plane portion 305, second plane portion 310, programming buffer block A 220, and programming buffer block B 225 concurrently.

Temporary parity generation component 113 generates parity data 325 using an exclusive-or operation on first plane portion data 315 and second plane portion data 320. In some embodiments, temporary parity generation component 113 programs programming buffer block A 220 and programming buffer block B 225 with first plane portion data 315 and second plane portion data 320 respectively while generating parity data 325 and programming parity data 325 into second parity buffer block 235.

In embodiments where adaptive buffer allocation component 113 uses multiple pass programming to program first plane portion 305 and second plane portion 310, programming buffer block A 220 and programming buffer block B 225 serve the dual functions of (1) protecting against programming block failure of first plane block 210 and second plane block 215 and (2) providing a readable copy of the user data during the coarse programming pass for first plane portion 305 and second plane portion 310. First parity buffer block 230, however, partially protects against programming failure of first plane block 210 and second plane block 215. Second parity buffer block 235, likewise partially protects against programming failure of first plane portion 305 and second plane portion 310.

In response to fully programming (i.e., finishing the fine programming pass for) first plane portion 305 and second plane portion 310, temporary parity generation component 113 invalidates or erases programming buffer block A 220 and programming buffer block B 225. Programming buffer block A 220 and programming buffer block B 225 therefore provide a readable copy of the user data during the coarse programming pass of first plane portion 305 and second plane portion 310 but do not protect the contents of first plane portion 305 and second plane portion 310 against programming block failure once programming buffer block A 220 and programming buffer block B 225 are erased. As the multiplane zone is only at 50% of being fully programmed, data can still be lost due to programming block failure of first plane block 210 or second plane block 215. First parity buffer block 230, however, contains parity data for first plane portion 245 and second plane portion 250 of FIG. 2 and second parity buffer block 235 contains parity data for first plane portion 305 and second plane portion 310 after programming buffer block A 220 and programming buffer block B 225 are erased and first parity buffer block 230 and second parity buffer block 235 can therefore be used to recover the data in the event of a programming block failure, reducing the likelihood of an increase in LIBER due to invalidating or erasing programming buffer block A 220 and programming buffer block B 225.

Figure 4:
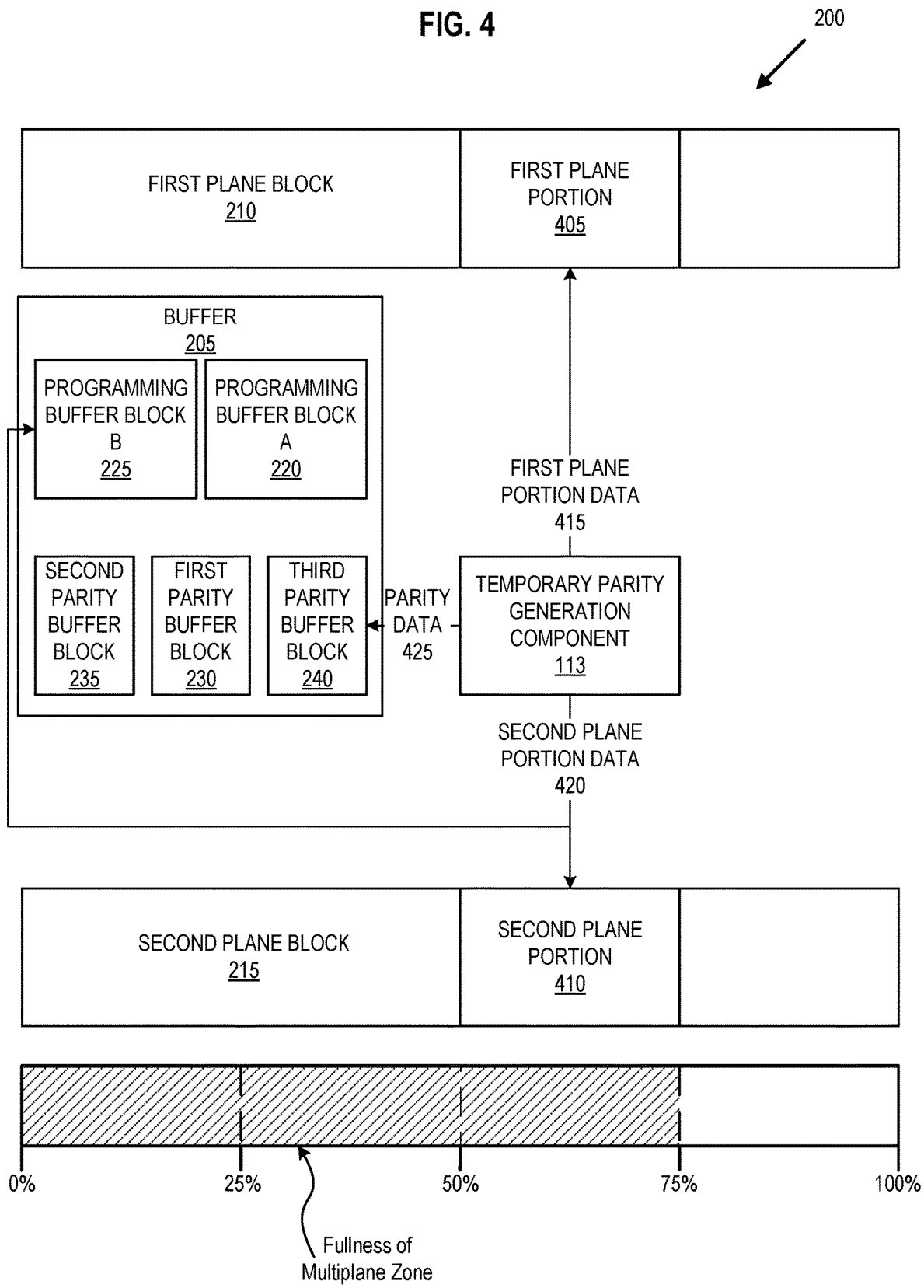
FIG. 4 is another block diagram of an example multiple-pass programming multiple-pass system using temporary parity generation in accordance with some embodiments of the present disclosure.

FIG. 4 is another block diagram of an example multiple-pass programming system 200 using temporary parity generation that includes a temporary parity generation component 113. First plane block 210 has subdivisions including first plane portion 405 and second plane block 215 has subdivisions including second plane portion 410.

In some embodiments, temporary parity generation component 113 receives a write command from a host device, such as host system 120 of FIG. 1 with user data including first plane portion data 415 and second plane portion data 420. For example, the user data can be a part of the write command that provided data for first plane portion data 255 and 315 and second plane portion data 260 and 320 as described above.

Temporary parity generation component 113 programs first plane portion 405 with first plane portion data 415 and programs second plane portion 410 with second plane portion data 420. Temporary parity generation component 113 also programs programming buffer block A 220 with first plane portion data 415 and programs programming buffer block B 225 with second plane portion data 420. First plane portion data 415 and second plane portion data 420 replace the buffered data from the previous portions held in programming buffer block A 220 and programming buffer block B 225. In some embodiments, temporary parity generation component 113 programs first plane portion 405, second plane portion 410, programming buffer block A 220, and programming buffer block B 225 concurrently.

Temporary parity generation component 113 also generates parity data 425 using an exclusive-or operation on first plane portion data 415 and second plane portion data 420. In some embodiments, temporary parity generation component 113 programs programming buffer block A 220 and programming buffer block B 225 with first plane portion data 415 and second plane portion data 420 respectively while generating parity data 425 and programming parity data 425 into third parity buffer block 240.

In embodiments where adaptive buffer allocation component 113 uses multiple pass programming to program first plane portion 405 and second plane portion 410, programming buffer block A 220 and programming buffer block B 225 serve the dual functions of (1) protecting against programming block failure of first plane block 210 and second plane block 215 and (2) providing a readable copy of the user data during the coarse programming pass for first plane portion 405 and second plane portion 410. First parity buffer block 230, however, partially protects against programming failure of first plane block 210 and second plane block 215. Second parity buffer block 235, likewise partially protects against programming failure of first plane portion 305 and second plane portion 310. Third parity buffer block 240, likewise partially protects against programming failure of first plane portion 405 and second plane portion 410.

In response to fully programming (i.e., finishing the fine programming pass for) first plane portion 405 and second plane portion 410, temporary parity generation component 113 invalidates or erases programming buffer block A 220 and programming buffer block B 225. Programming buffer block A 220 and programming buffer block B 225 therefore provide a readable copy of the user data during the coarse programming pass of first plane portion 405 and second plane portion 410 but do not protect the contents of first plane portion 405 and second plane portion 410 against programming block failure once programming buffer block A 220 and programming buffer block B 225 are erased. As the multiplane zone is only at 75% of being fully programmed, data can still be lost due to programming block failure of first plane block 210 or second plane block 215. First parity buffer block 230 contains parity data for first plane portion 245 and second plane portion 250 of FIG. 2. Second parity buffer block 235 contains parity data for first plane portion 305 and second plane portion 310 of FIG. 3. Third parity buffer block 240 contains parity data for first plane portion 405 and second plane portion 410 after programming buffer block A 220 and programming buffer block B 225 are erased. First parity buffer block 230, second parity buffer block 235, and third parity buffer block 240 can therefore be used to recover the data in the event of a programming block failure, reducing the likelihood of an increase in UBER due to invalidating or erasing programming buffer block A 220 and programming buffer block B 225.

Figure 5:
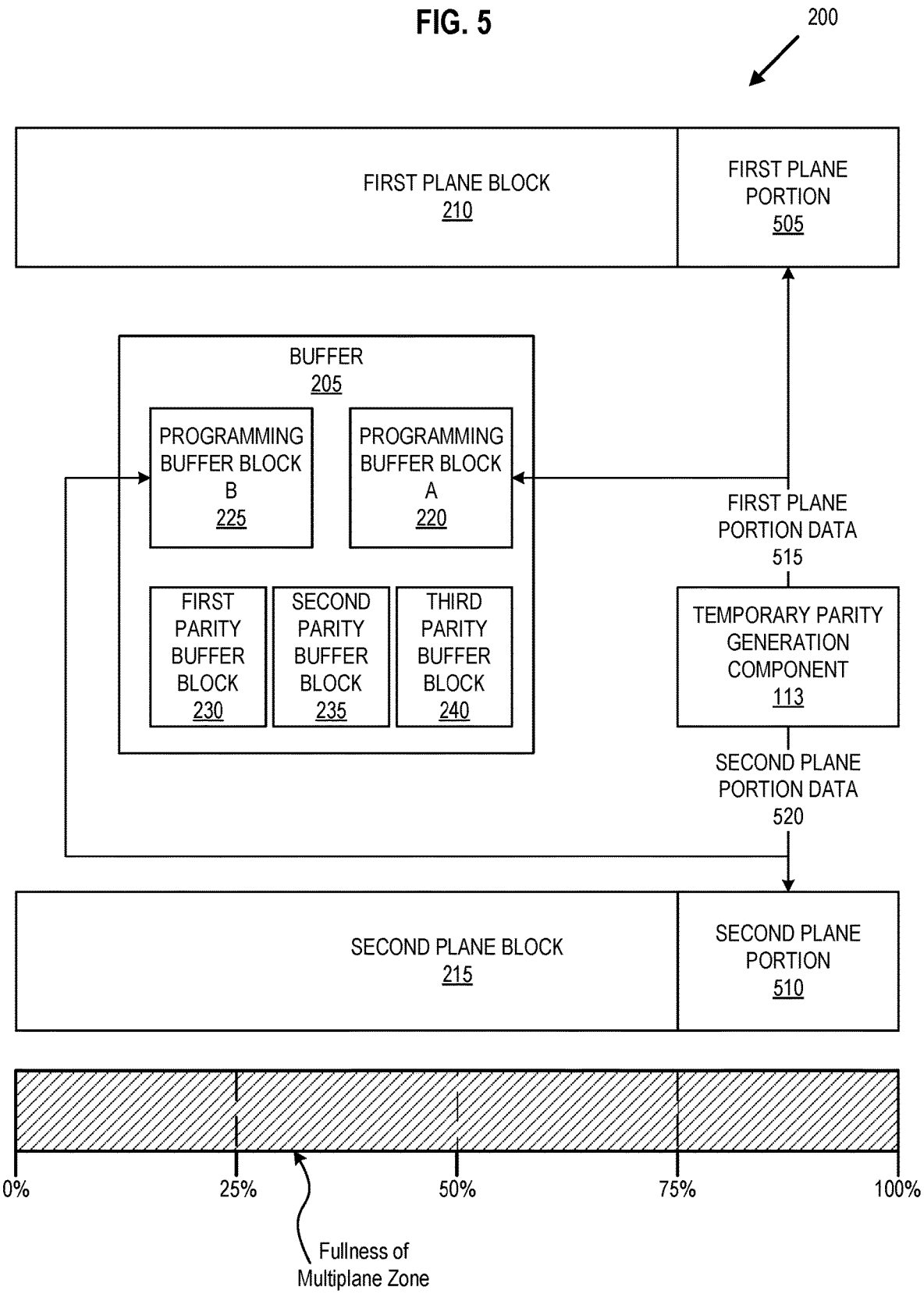
FIG. 5 is another block diagram of an example multiple-pass programming multiple-pass system using temporary parity generation in accordance with some embodiments of the present disclosure.

FIG. 5 is another block diagram of an example multiple-pass programming system 200 using temporary parity generation that includes a temporary parity generation component 113. First plane block 210 has subdivisions including first plane portion 505 and second plane block 215 has subdivisions including second plane portion 510.

In some embodiments, temporary parity generation component 113 receives a write command from a host device, such as host system 120 of FIG. 1 with user data including first plane portion data 515 and second plane portion data 520. For example, the user data can be a part of the write command that provided data for first plane portion data 255, 315, and 415 and second plane portion data 260, 320, and 420 as described above.

Temporary parity generation component 113 programs first plane portion 505 with first plane portion data 515 and programs second plane portion 510 with second plane portion data 520. Temporary parity generation component 113 also programs programming buffer block A 220 with first plane portion data 515 and programs programming buffer block B 225 with second plane portion data 520. First plane portion data 515 and second plane portion data 520 replace the buffered data from the previous portions held in programming buffer block A 220 and programming buffer block B 225. In some embodiments, temporary parity generation component 113 programs first plane portion 505, second plane portion 510, programming buffer block A 220, and programming buffer block B 225 concurrently.

In embodiments where adaptive buffer allocation component 113 uses multiple pass programming to program first plane portion 505 and second plane portion 510, programming buffer block A 220, programming buffer block B 225, first parity buffer block 230, second parity buffer block 235, and third parity buffer block 240 serve the dual functions of (1) protecting against programming block failure of first plane block 210 and second plane block 215 and (2) providing a readable copy of the user data during the coarse programming pass for first plane portion 505 and second plane portion 510. First parity buffer block 230, however, partially protects against programming failure of first plane block 210 and second plane block 215. Second parity buffer block 235, likewise partially protects against programming failure of first plane portion 305 and second plane portion 310.

In response to fully programming (i.e., finishing the fine programming pass for) first plane portion 505 and second plane portion 510, temporary parity generation component 113 scans first plane block 210 and second plane block 215 to verify correct programming. In response to successfully verifying that first plane block 210 and second plane block 215 have been correctly programmed, temporary parity generation component 113 erases or otherwise invalidates buffer 205 and therefore its components: programming buffer block A 220, programming buffer block B 225, first parity buffer block 230, second parity buffer block 235, and third parity buffer block 240.

If, however, there is a programming failure during the programming of first plane portion 505 and second plane portion 510, first parity buffer block 230 contains parity data for first plane portion 245 and second plane portion 250 of FIG. 2, second parity buffer block 235 contains parity data for first plane portion 305 and second plane portion 310 of FIG. 3, and third parity buffer block 240 contains parity data for first plane portion 405 and second plane portion 410 of FIG. 4. Likewise, programming buffer block A 220 still holds first plane portion data 515 and programming buffer block B 225 still holds second plane portion data 520. First parity buffer block 230, second parity buffer block 235, third parity buffer block 240, programming buffer block A 220, and programming buffer block B 225 can therefore be used to recover the data in the event of a programming block failure, reducing the likelihood of an increase in UBER due to invalidating or erasing programming buffer block A 220 and programming buffer block B 225. Similarly, if temporary parity generation component 113 detects programming errors while scanning first plane block 210 and second plane block 215, first parity buffer block 230, second parity buffer block 235, third parity buffer block 240, programming buffer block A 220, and programming buffer block B 225 can be used to recreate the data, reducing the likelihood of an increase in UBER.

Figure 6:
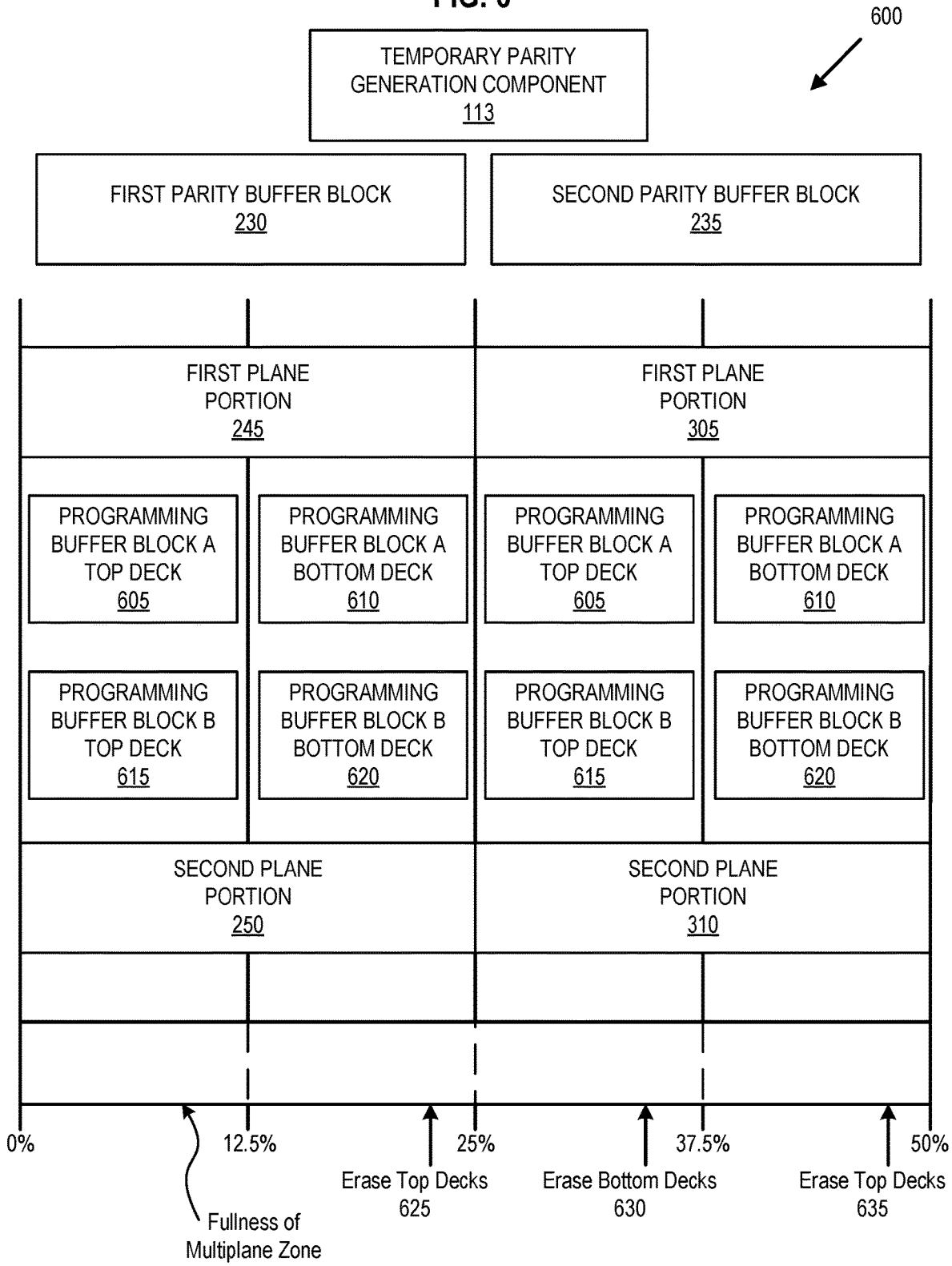
FIG. 6 is another block diagram of an example multiple-pass programming multiple-pass system using temporary parity generation in accordance with some embodiments of the present disclosure.

FIG. 6 is another block diagram of an example multiple-pass programming system 600 using temporary parity generation including temporary parity generation component 113. Multiple-pass programming system 600 also includes first parity buffer block 230, second parity buffer block 235, first plane portion 245, first plane portion 305, programming buffer block A top deck 605, programming buffer block A bottom deck 610, programming buffer block B top deck 615, programming buffer block B bottom deck 620, second plane portion 250, and second plane portion 310. Although not explicitly illustrated, first plane portion 245 and first plane portion 305 are subdivisions of a plane block such as first plane block 210 of FIGS. 2-5. Similarly, second plane portion 250 and second plane portion 310 are subdivisions of a different plane block such as second plane block 215 of FIGS. 2-5. Additionally, programming buffer block A top deck 605 and programming buffer block A bottom deck 610 are decks of a programming buffer block, such as programming buffer block A 220 of FIGS. 2-5. Likewise, programming buffer block B top deck 615 and programming buffer block B bottom deck 620 are part of a programming buffer block, such as programming buffer block B 225 of FIGS. 2-5.

In some embodiments, although only two decks are illustrated for each programming buffer block (e.g., the pair of programming buffer block A top deck 605 and programming buffer block A bottom deck 610 and the pair of programming buffer block B top deck 615 and programming buffer block B bottom deck 620), the memory block can be divided into more than two decks. For the purposes of this disclosure, the term deck refers to an independently erasable subdivision of a memory block. In some embodiments, a deck may not be the smallest programmable subdivision of a memory block and the deck may also contain subdivisions within itself, such as wordlines. Wordlines are subdivisions of decks and therefore also subdivisions of blocks that are independently programmable.

Temporary parity generation component 113 programs first plane portions 245 and 305 and second plane portions 250 and 310 with user data and buffers the data by also storing it in programming buffer block A top deck 605, programming buffer block A bottom deck 610, programming buffer block B top deck 615, and programming buffer block B bottom deck 620. Temporary parity generation component 113 also generates parity data from the user data stored in programming buffer block A top deck 605, programming buffer block A bottom deck 610, programming buffer block B top deck 615, and programming buffer block B bottom deck 620 and stores this parity data in first parity buffer block 230 and second parity buffer block 235. In one embodiment, temporary parity generation component 113 concurrently programs a wordline of the pair of first plane portion 245 and programming buffer block A top deck 605 and the pair of the second plane portion 250 and programming buffer block B top deck 615. In such an embodiment, each of the pair of first plane portion 245 and programming buffer block A top deck 605 and the pair of the second plane portion 250 and programming buffer block B top deck 615 is programmed wordline by wordline. Temporary parity generation component 113 concurrently generates parity data based on the wordlines programmed and stores the parity data as a wordline in first parity buffer block 230. This process continues until programming buffer block A top deck 605 and programming buffer block B top deck 615 are fully programmed, at which point temporary parity generation component 113 continues the process with programming buffer block A bottom deck 610 and programming buffer block B bottom deck 620.

In response to reaching a percentage of fullness of the multiplane zone denoted by erase top decks 625, temporary parity generation component 113 erases or otherwise invalidates the data stored in programming buffer block A top deck 605 and programming buffer block B top deck 615. The percentage of fullness of the multiplane zone denoted by erase top decks 625 is determined such that the user data has been fully programmed (i.e., finished the fine programming pass) to the first portion of first plane portion 245 and second plane portion 250 (the portions buffered by the user data in programming buffer block A top deck 605 and programming buffer block B top deck 615). In some embodiments, each of programming buffer block decks 605, 610, 615, and 620 are programmed wordline by wordline and erased deck by deck.

Because the fine programming pass has been completed, the user data buffered in programming buffer block A top deck 605 and programming buffer block B top deck 615 is no longer needed to provide a readable copy during the coarse programming pass of first plane portion 245 and second plane portion 250. Additionally, in the event of a programming block failure, first parity buffer block 230 holds parity data for the user data stored in first plane portion 245 and second plane portion 250 and can therefore be used to recover lost data in the event of a programming block failure, reducing the likelihood of an increase in LIBER due to invalidating or erasing programming buffer block A top deck 605 and programming buffer block B top deck 615.

The percentage of fullness of the multiplane zone indicates the progress of temporary parity generation component 113 programming the plane blocks including first plane portions 245 and 305 and second plane portions 250 and 310. In some embodiments, the percentage of fullness of the multiplane zone indicates the progress of temporary parity generation component 113 conducting a coarse programming pass on the plane blocks. For example, the percentage indicated by erase top decks 625 and 635 and erase bottom decks 630 is reached when first plane portion 245 and second plane portion 250 undergo a coarse programming pass to that point. Because the previous wordlines of first plane portion 245 and second plane portion 250 are concurrently undergoing a fine programming pass, erase top decks 625 and 635 and erase bottom decks 630 also indicate that the fine programming pass has been completed for the programming buffer block top decks and bottom decks respectively. In some embodiments, the percentage of fullness of the multiplane zone denoted by erase top decks 625 and 635 and erase bottom decks 630 depends on a number of variables including the time for a controller (such as memory subsystem controller 115) to execute operations, the time required to queue future pages in memory, the speed of controller/controller firmware, the efficiency of the controller/controller firmware, the size of independently erasable/programmable portions, and similar metrics.

In response to erasing or otherwise invalidating the data stored in programming buffer block A top deck 605 and programming buffer block B top deck 615, temporary parity generation component 113 allocates programming buffer block A top deck 605 and programming buffer block B top deck 615 to the next portions (e.g., first plane portion 305 and second plane portion 310). Additionally, temporary parity generation component 113 loads a portion of the user data for the next portions into programming buffer block A top deck 605 and programming buffer block B top deck 615.

In response to finishing a coarse programming pass of first plane portion 245 and second plane portion 250, temporary parity generation component 113 concurrently programs a wordline of the pair of first plane portion 305 and programming buffer block A top deck 605 and the pair of the second plane portion 310 and programming buffer block B top deck 615. Temporary parity generation component 113 concurrently generates parity data based on the wordlines programmed and stores the generate parity data as a wordline in second parity buffer block 235.

In response to reaching a percentage of fullness of the multiplane zone denoted by erase bottom decks 630, temporary parity generation component 113 erases or otherwise invalidates the data stored in programming buffer block A bottom deck 610 and programming buffer block B bottom deck 620. The percentage of fullness of the multiplane zone denoted by erase bottom decks 630 is determined such that the user data has been fully programmed (i.e., finished the fine programming pass) to the second portion of first plane portion 245 and second plane portion 250 (the portion buffered by the user data in programming buffer block A bottom deck 610 and programming buffer block B bottom deck 620).

Because the fine programming pass has been completed, the user data buffered in programming buffer block A bottom deck 610 and programming buffer block B bottom deck 620 is no longer needed to provide a readable copy of the user data during the coarse programming pass of first plane portion 245 and second plane portion 250. Additionally, in the event of a programming block failure, first parity buffer block 230 holds parity data for the user data stored in first plane portion 245 and second plane portion 250 and can therefore be used to recover lost data in the event of a programming block failure, reducing the likelihood of an increase in LIBER due to invalidating or erasing programming buffer block A top deck 605 and programming buffer block B top deck 615.

In response to erasing or otherwise invalidating the data stored in programming buffer block A bottom deck 610 and programming buffer block B bottom deck 620, temporary parity generation component 113 allocates programming buffer block A bottom deck 610 and programming buffer block B bottom deck 620 to the next portions (e.g., first plane portion 305 and second plane portion 310). Additionally, temporary parity generation component 113 loads a portion of the user data for the next portions into programming buffer block A bottom deck 610 and programming buffer block B bottom deck 620.

Temporary parity generation component 113 continues programming wordlines of first plane portion 305, programming buffer block A top deck 605, second plane portion 310, programming buffer block B top deck 615, and second parity buffer block 235. This process continues until programming buffer block A top deck 605 and programming buffer block B top deck 615 are full, at which point temporary parity generation component 113 continues the process with programming buffer block A bottom deck 610 and programming buffer block B bottom deck 620.

In response to reaching a percentage of fullness of the multiplane zone denoted by erase top decks 635, temporary parity generation component 113 erases or otherwise invalidates the data stored in programming buffer block A top deck 605 and programming buffer block B top deck 615. The percentage of fullness of the multiplane zone denoted by erase top decks 635 is determined such that the user data has been fully programmed (i.e., finished the fine programming pass) to the first portion of first plane portion 305 and second plane portion 310 (the portion buffered by the user data in programming buffer block A top deck 605 and programming buffer block B top deck 615).

Because the fine programming pass has been completed, the user data buffered in programming buffer block A top deck 605 and programming buffer block B top deck 615 is no longer needed to provide a readable copy of the user data during the coarse programming pass of first plane portion 305 and second plane portion 310. Additionally, in the event of a programming block failure, first parity buffer block 230 holds parity data for the user data stored in first plane portion 245 and second plane portion 250 and second parity buffer block 235 holds parity data for the user data stored in first plane portion 305 and second plane portion 310. First parity buffer block 230 and second parity buffer block 235 can therefore be used to recover the lost data in the event of a programming block failure, reducing the likelihood of an increase in LIBER due to invalidating or erasing programming buffer block A top deck 605 and programming buffer block B top deck 615.

Figure 7:
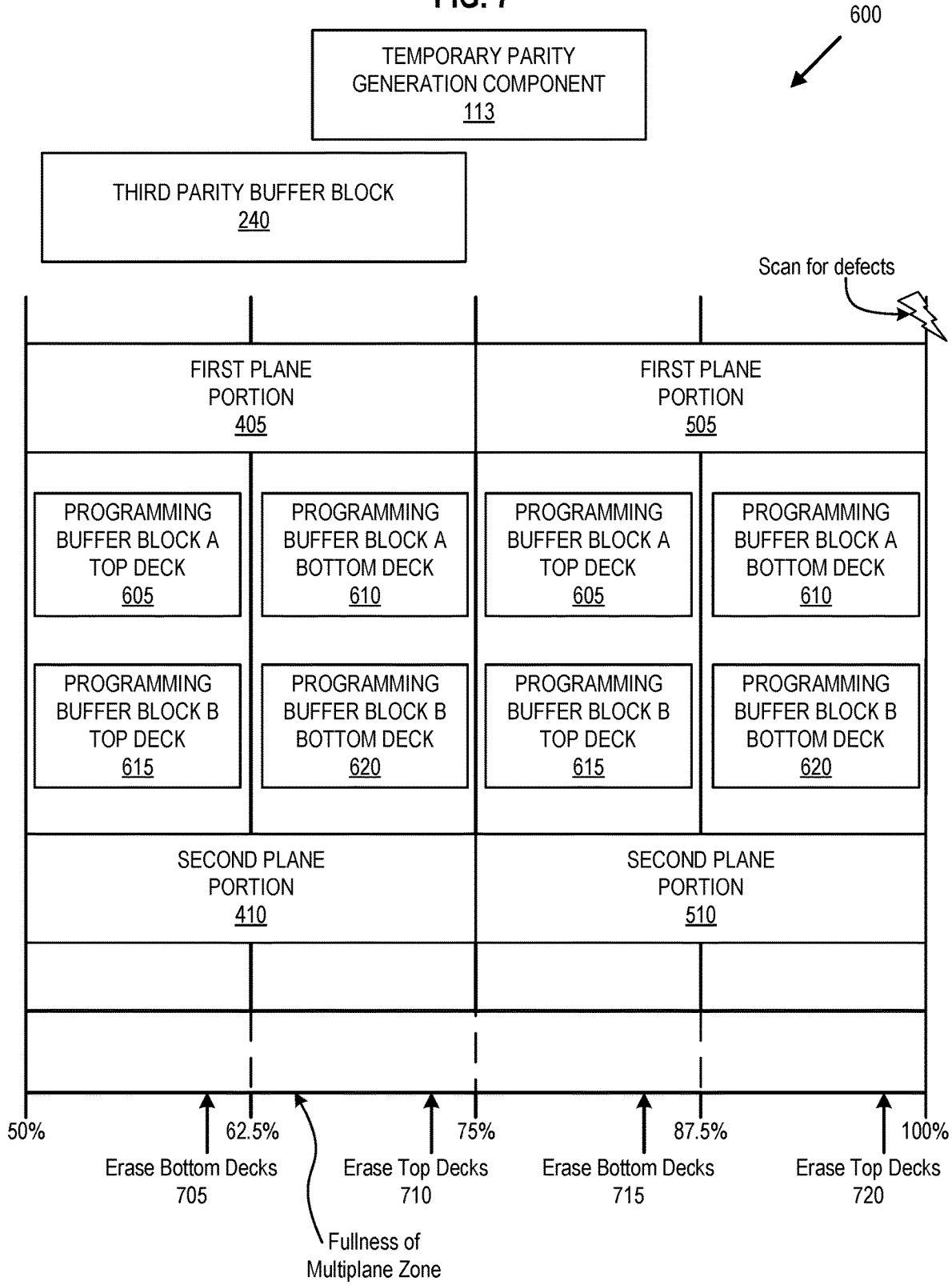
FIG. 7 is another block diagram of an example multiple-pass programming multiple-pass system using temporary parity generation in accordance with some embodiments of the present disclosure.

In response to erasing or otherwise invalidating the data stored in programming buffer block A top deck 605 and programming buffer block B top deck 615, temporary parity generation component 113 allocates programming buffer block A top deck 605 and programming buffer block B top deck 615 to the next portions (e.g., first plane portion 405 and second plane portion 410 of FIG. 7). Additionally, temporary parity generation component 113 loads a portion of the user data for the next portions into programming buffer block A top deck 605 and programming buffer block B top deck 615.

Temporary parity generation component 113 continues programming wordlines of first plane portion 305, programming buffer block A bottom deck 610, second plane portion 310, programming buffer block B bottom deck 620, and second parity buffer block 235. This process continues until programming buffer block A bottom deck 610 and programming buffer block B bottom deck 620 are full.

FIG. 7 is another block diagram of an example multiple-pass programming system 600 using temporary parity generation including temporary parity generation component 113. Multiple-pass programming system 600 further includes third parity buffer block 240, first plane portions 405 and 505 and second plane portions 410 and 510.

In response to finishing a coarse programming pass of first plane portion 305 and second plane portion 310 of FIG. 6, temporary parity generation component 113 concurrently programs a wordline of the pair of first plane portion 405 and programming buffer block A top deck 605 and the pair of the second plane portion 410 and programming buffer block B top deck 615. Temporary parity generation component 113 concurrently generates parity data based on the wordlines programmed and stores the generate parity data as a wordline in third parity buffer block 240.

In response to reaching a percentage of fullness of the multiplane zone denoted by erase bottom decks 705, temporary parity generation component 113 erases or otherwise invalidates the data stored in programming buffer block A bottom deck 610 and programming buffer block B bottom deck 620. The percentage of fullness of the multiplane zone denoted by erase bottom decks 705 is determined such that the user data has been fully programmed (i.e., finished the fine programming pass) to the second portion of first plane portion 305 and second plane portion 310 (the portion buffered by the user data in programming buffer block A bottom deck 610 and programming buffer block B bottom deck 620).

Because the fine programming pass has been completed, the user data buffered in programming buffer block A bottom deck 610 and programming buffer block B bottom deck 620 is no longer needed to provide a readable copy of the user data during the coarse programming pass of first plane portion 305 and second plane portion 310. Additionally, in the event of a programming block failure, first parity buffer block 230 holds parity data for the user data stored in first plane portion 245 and second plane portion 250 and second parity buffer block 235 holds parity data for the user data stored in first plane portion 305 and second plane portion 310. First parity buffer block 230 and second parity buffer block 235 can therefore be used to recover the lost data in the event of a programming block failure, reducing the likelihood of an increase in LIBER due to invalidating or erasing programming buffer block A bottom deck 610 and programming buffer block B bottom deck 620.

In response to erasing or otherwise invalidating the data stored in programming buffer block A bottom deck 610 and programming buffer block B bottom deck 620, temporary parity generation component 113 allocates programming buffer block A bottom deck 610 and programming buffer block B bottom deck 620 to the next portions (e.g., first plane portion 305 and second plane portion 310). Additionally, temporary parity generation component 113 loads a portion of the user data for the next portions into programming buffer block A bottom deck 610 and programming buffer block B bottom deck 620.

Temporary parity generation component 113 continues programming wordlines of first plane portion 405, programming buffer block A top deck 605, second plane portion 410, programming buffer block B top deck 615, and third parity buffer block 240. This process continues until programming buffer block A top deck 605 and programming buffer block B top deck 615 are full, at which point temporary parity generation component 113 continues the process with programming buffer block A bottom deck 610 and programming buffer block B bottom deck 620.

In response to reaching a percentage of fullness of the multiplane zone denoted by erase top decks 710, temporary parity generation component 113 erases or otherwise invalidates the data stored in programming buffer block A top deck 605 and programming buffer block B top deck 615. The percentage of fullness of the multiplane zone denoted by erase top decks 710 is determined such that the user data has been fully programmed (i.e., finished the fine programming pass) to the first portion of first plane portion 405 and second plane portion 410 (the portion buffered by the user data in programming buffer block A top deck 605 and programming buffer block B top deck 615).

Because the fine programming pass has been completed, the user data buffered in programming buffer block A top deck 605 and programming buffer block B top deck 615 is no longer needed to provide a readable copy of the user data during the coarse programming pass of first plane portion 305 and second plane portion 310. Additionally, in the event of a programming block failure, first parity buffer block 230 holds parity data for the user data stored in first plane portion 245 and second plane portion 250. Second parity buffer block 235 holds parity data for the user data stored in first plane portion 305 and second plane portion 310. Third parity buffer block 240 holds parity data for the user data stored in first plane portion 405 and second plane portion 410. First parity buffer block 230, second parity buffer block 235, and third parity buffer block 240 can therefore be used to recover the lost data in the event of a programming block failure, reducing the likelihood of an increase in LIBER due to invalidating or erasing programming buffer block A top deck 605 and programming buffer block B top deck 615.

In response to erasing or otherwise invalidating the data stored in programming buffer block A top deck 605 and programming buffer block B top deck 615, temporary parity generation component 113 allocates programming buffer block A top deck 605 and programming buffer block B top deck 615 to the next portions (e.g., first plane portion 505 and second plane portion 510). Additionally, temporary parity generation component 113 loads a portion of the user data for the next portions into programming buffer block A top deck 605 and programming buffer block B top deck 615.

In response to finishing a coarse programming pass of first plane portion 405 and second plane portion 410, temporary parity generation component 113 concurrently programs a wordline of the pair of first plane portion 505 and programming buffer block A top deck 605 and the pair of the second plane portion 510 and programming buffer block B top deck 615.

In response to reaching a percentage of fullness of the multiplane zone denoted by erase bottom decks 715, temporary parity generation component 113 erases or otherwise invalidates the data stored in programming buffer block A bottom deck 610 and programming buffer block B bottom deck 620. The percentage of fullness of the multiplane zone denoted by erase bottom decks 715 is determined such that the user data has been fully programmed (i.e., finished the fine programming pass) to the second portion of first plane portion 405 and second plane portion 410 (the portion buffered by the user data in programming buffer block A bottom deck 610 and programming buffer block B bottom deck 620).

Because the fine programming pass has been completed, the user data buffered in programming buffer block A bottom deck 610 and programming buffer block B bottom deck 620 is no longer needed to provide a readable copy of the user data during the coarse programming pass of first plane portion 405 and second plane portion 410. Additionally, in the event of a programming block failure, first parity buffer block 230 holds parity data for the user data stored in first plane portion 245 and second plane portion 250. Second parity buffer block 235 holds parity data for the user data stored in first plane portion 305 and second plane portion 310. Third parity buffer block 240 holds parity data for the user data stored in first plane portion 405 and second plane portion 410. First parity buffer block 230, second parity buffer block 235, and third parity buffer block 240 can therefore be used to recover the lost data in the event of a programming block failure, reducing the likelihood of an increase in LIBER due to invalidating or erasing programming buffer block A bottom deck 610 and programming buffer block B bottom deck 620.

In response to erasing or otherwise invalidating the data stored in programming buffer block A bottom deck 610 and programming buffer block B bottom deck 620, temporary parity generation component 113 allocates programming buffer block A bottom deck 610 and programming buffer block B bottom deck 620 to the next portions (e.g., first plane portion 505 and second plane portion 510). Additionally, temporary parity generation component 113 loads a portion of the user data for the next portions into programming buffer block A bottom deck 610 and programming buffer block B bottom deck 620.

Temporary parity generation component 113 continues programming wordlines of first plane portion 505, programming buffer block A top deck 605, second plane portion 510, and programming buffer block B top deck 615. This process continues until programming buffer block A top deck 605 and programming buffer block B top deck 615 are full, at which point temporary parity generation component 113 continues the process with programming buffer block A bottom deck 610 and programming buffer block B bottom deck 620.

In some embodiments, in response to determining that there are memory blocks to program after first plane portion 505 and second plane portion 510 and in response to reaching a percentage of fullness of the multiplane zone denoted by erase top decks 720, temporary parity generation component 113 erases or otherwise invalidates the data stored in programming buffer block A top deck 605 and programming buffer block B top deck 615. The percentage of fullness of the multiplane zone denoted by erase top decks 720 is determined such that the user data has been fully programmed (i.e., finished the fine programming pass) to the first portion of first plane portion 505 and second plane portion 510 (the portion buffered by the user data in programming buffer block A top deck 605 and programming buffer block B top deck 615).

Because the fine programming pass has been completed, the user data buffered in programming buffer block A top deck 605 and programming buffer block B top deck 615 is no longer needed to prevent data loss in programming the corresponding decks of user data to first plane portion 505 and second plane portion 510. Additionally, in the event of a programming block failure, first parity buffer block 230 holds parity data for the user data stored in first plane portion 245 and second plane portion 250. Second parity buffer block 235 holds parity data for the user data stored in first plane portion 305 and second plane portion 310. Third parity buffer block 240 holds parity data for the user data stored in first plane portion 405 and second plane portion 410. First parity buffer block 230, second parity buffer block 235, and third parity buffer block 240 can therefore be used to recover the lost data in the event of a programming block failure, reducing the likelihood of an increase in LIBER.

In some embodiments, in response to determining that there are no memory blocks to program after first plane portion 505 and second plane portion 510, temporary parity generation component 113 does not erase or otherwise invalidate the top decks. In such embodiments, first parity buffer block 230, second parity buffer block 235, third parity buffer block 240, programming buffer block A top deck 605, programming buffer block A bottom deck 610, programming buffer block B top deck 615, and programming buffer block B bottom deck 620 can be used to recover the lost data in the event of a programming block failure, even further reducing the likelihood of an increase in LIBER due to invalidating or erasing programming buffer block A top deck 605 and programming buffer block B top deck 615.

In response to determining that there are memory blocks to program after first plane portion 505 and second plane portion 510 and in response to erasing or otherwise invalidating the data stored in programming buffer block A top deck 605 and programming buffer block B top deck 615, temporary parity generation component 113 allocates programming buffer block A top deck 605 and programming buffer block B top deck 615 to the next portions (e.g., portions of the next two plane blocks). Additionally, temporary parity generation component 113 loads a portion of the user data for the next portions into programming buffer block A top deck 605 and programming buffer block B top deck 615.

Temporary parity generation component 113 continues programming wordlines of first plane portion 505, programming buffer block A bottom deck 610, second plane portion 510, and programming buffer block B bottom deck 620. This process continues until programming buffer block A bottom deck 610 and programming buffer block B bottom deck 620 are full.

In response to fully programming first plane portion 505 and second plane portion 510 (i.e., finishing the fine programming pass), temporary parity generation component 113 scans the plane blocks to verify correct programming. In response to successfully verifying that the plane blocks have been correctly programmed, temporary parity generation component 113 erases or otherwise invalidates programming buffer block A bottom deck 610 and programming buffer block B bottom deck 620, first parity buffer block 230, second parity buffer block 235, and third parity buffer block 240.

If, however, there is a programming failure during the programming of the plane blocks, first parity buffer block 230 contains parity data for first plane portion 245 and second plane portion 250. Second parity buffer block 235 contains parity data for first plane portion 305 and second plane portion 310. Third parity buffer block 240 contains parity data for first plane portion 405 and second plane portion 410. Likewise, programming buffer block A bottom deck 610 still holds user data for the second portion of first plane portion 505 and programming buffer block B bottom deck 620 still holds user data for the second portion of second plane portion 510. First parity buffer block 230, second parity buffer block 235, third parity buffer block 240, programming buffer block A bottom deck 610, and programming buffer block B bottom deck 620 can therefore be used to recover the lost data in the event of a programming block failure, reducing the likelihood of an increase in UBER. Similarly, if temporary parity generation component 113 detects programming errors while scanning first plane block 210 and second plane block 215, first parity buffer block 230, second parity buffer block 235, third parity buffer block 240, programming buffer block A bottom deck 610, and programming buffer block B bottom deck 620 can be used to recover the lost data, reducing the likelihood of an increase in UBER.

Figure 8:
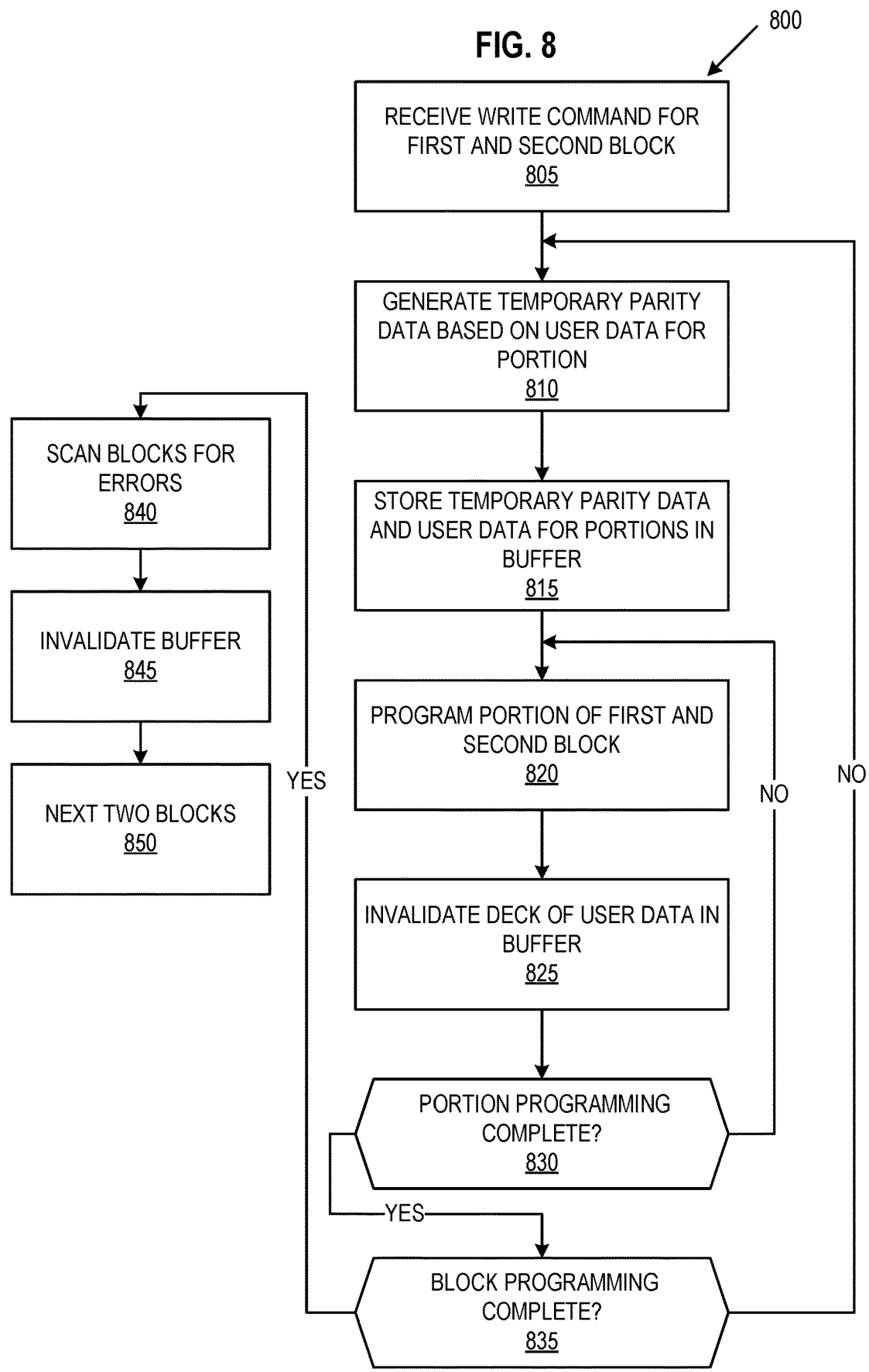
FIG. 8 is a flow diagram of an example method to program memory cells in multiple passes using temporary parity generation in accordance with some embodiments of the present disclosure.

FIG. 8 is a flow diagram of an example method 800 to program memory cells in multiple passes using temporary parity data in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the temporary parity generation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 805, the processing device receives a write command for two or more blocks of data. For example, the processing device receives a write command from a host device, such as host system 120 of FIG. 1 with user data and a logical address. The processing device translates the logical address to a physical address and determines where to write the user data based on the physical address. In response to receiving a write command, the processing device executes operation 810.

At operation 810, the processing device generates temporary parity data based on user data for the current portion. For example, the physical address translated from the write command received at operation 805 correlates to two blocks in separate planes such that they can be concurrently programmed (such as first plane block 210 and second plane block 215 of FIGS. 2-5). Each of the two blocks are composed of one or more portions. In one embodiment, the processing device performs an exclusive-or operation on the user data for the first plane portion and the user data for the second plane portion to generate the temporary parity data.

At operation 815, the processing device stores the temporary parity data and user data for the portions in the buffer. In some embodiments, the buffer is composed of a first programming buffer block (such as programming buffer block A 220 of FIG. 2), a second programming buffer block (such as programming buffer block B 225 of FIG. 2), and multiple parity buffer blocks (such as first parity buffer block 230, second parity buffer block 235, and third parity buffer block 240). In some embodiments, each of the programming buffer blocks is also composed of decks.

In some embodiments, the first plane portion and the second plane portion are composed of QLCs. In such embodiments, the buffer is composed of SLCs. In other embodiments, different cell types may be used for the first plane portion, the second plane portion, and/or the buffer.

At operation 820, the processing device programs the user data to corresponding portions of the first and second block. In some embodiments, the programming involves multiple pass programming. For example, the processing device programs the first plane portion and the second plane portion in two passes, a coarse programming pass and a fine programming pass.

At operation 825, the processing device erases or otherwise invalidates the buffer decks of user data associated with the first plane portion and the second plane portion. In some embodiments, the processing device allocates the invalidated decks to the next portions of the first plane and the second plane. In some embodiments, the processing device invalidates the buffer decks in response to completing the second pass of programming for the associated first plane portion and second plane portion.

At operation 830, the processing device determines whether the programming of the portion is complete. For example, the processing device determines whether a second pass of programming has been completed the first plane portion and the second plane portion. If the portion programming is complete, the processing device proceeds to operation 835. If the portion programming is incomplete, the method 800 returns to operation 820 and programs the next portions of the first plane and the second plane. In some embodiments, although not illustrated, if the portion programming is incomplete, the method 800 instead returns to operation 810 (e.g., if the generation of parity data for the portion is also incomplete).

At operation 835, the processing device determines whether the block programming is complete. For example, the processing device determines whether a second pass of programming has been completed the first plane block and the second plane block. If the block programming is complete, the method 800 proceeds to operation 840. If the portion programming is incomplete, the method 800 returns to operation 810 and generates temporary parity data for the next portions of the first plane and the second plane.

At operation 840, the processing device scans the blocks for errors. For example, the processing device scans the first plane block and the second plane block to verify correct programming. In response to the scan detecting errors, the processing device attempts to correct the errors in first plane block and second plane block using the user data and parity data stored in the buffer.

At operation 845, the processing device invalidates the buffer. For example, the processing device erases or otherwise invalidates the user data and the parity data stored in the buffer. In some embodiments, certain decks of the buffer are cleared and allocated to successive blocks. In such embodiments, the contents of the buffer that correspond to buffered user data or parity data for the programmed blocks are invalidated while the contents of the buffer that correspond to successive blocks are kept.

At operation 850, the processing device moves to the next two memory blocks. For example, the processing device begins back at operation 810 for the next two blocks in line. In some embodiments, when all the memory blocks have been programmed, the processing device does not return to operation 810 and instead waits for the next write command to trigger operation 805.

Figure 9:
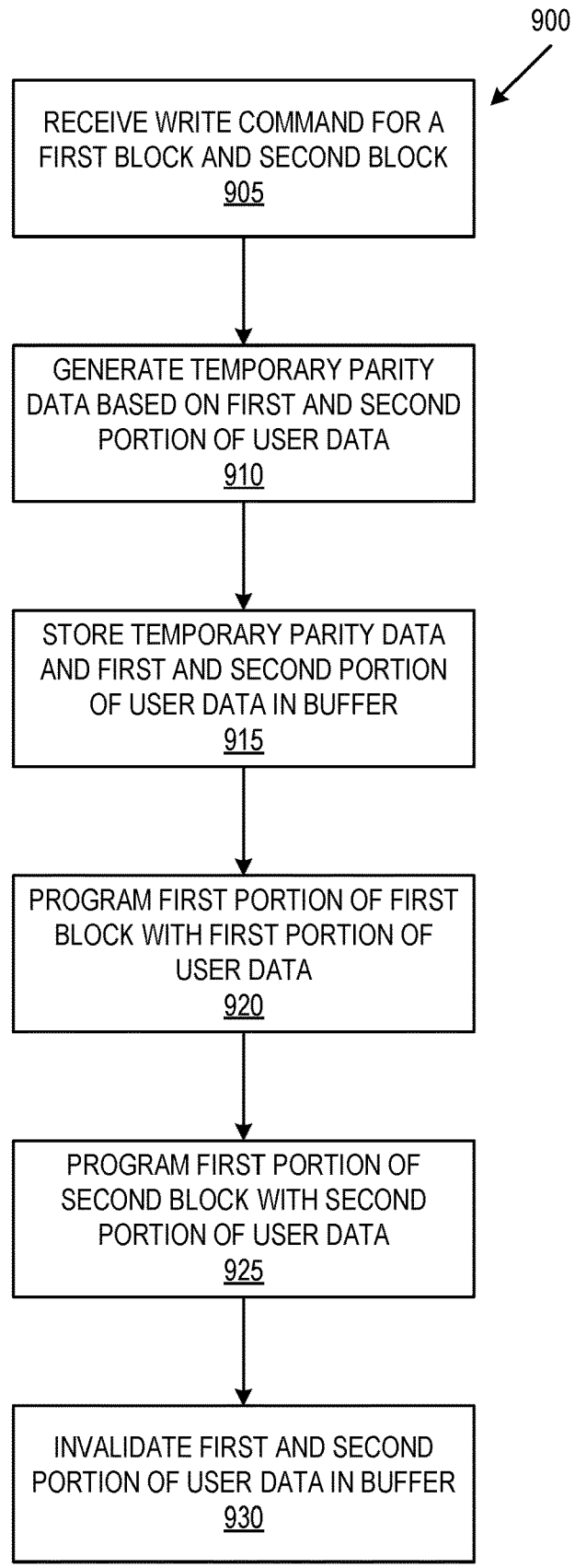
FIG. 9 is another flow diagram of an example method to program memory cells in multiple passes using temporary parity generation in accordance with some embodiments of the present disclosure.

FIG. 9 is a flow diagram of an example method 900 to program memory cells in multiple passes using temporary parity data, in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the temporary parity generation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 905, the processing device receives a write command for two or more blocks of data. For example, the processing device receives a write command from a host device, such as host system 120 of FIG. 1 with user data and a logical address. The processing device translates the logical address to a physical address and determines where to write the user data based on the physical address.

At operation 910, the processing device generates temporary parity data based on a first and second portion of user data. For example, the physical address translated from the write command received at operation 905 correlates to two blocks in separate planes such that they can be concurrently programmed (such as first plane block 210 and second plane block 215 of FIGS. 2-5). Each of the two blocks are composed of one or more portions. In one embodiment, the processing device performs an exclusive-or operation on the user data for the first plane portion (i.e., first portion of user data) and the user data for the second plane portion (i.e., first portion of user data) to generate the temporary parity data.

At operation 915, the processing device stores the temporary parity data and the first and second portion of user data in a buffer. In some embodiments, the buffer is composed of a first programming buffer block (such as programming buffer block A 220 of FIG. 2), a second programming buffer block (such as programming buffer block B 225 of FIG. 2), and multiple parity buffer blocks (such as first parity buffer block 230, second parity buffer block 235, and third parity buffer block 240). In some embodiments, each of the programming buffer blocks is also composed of decks.

In some embodiments, the first plane portion and the second plane portion are composed of QLCs. In such embodiments, the buffer is composed of SLCs. In other embodiments, different cell types may be used for the first plane portion, the second plane portion, and the buffer.

At operation 920, the processing device programs a first portion of the first block with the first portion of user data. In some embodiments, the programming involves multiple pass programming. For example, the processing device programs the first plane portion in two passes, a coarse programming pass and a fine programming pass.

At operation 925, the processing device programs a first portion of the second block with the second portion of user data. In some embodiments, the programming involves multiple pass programming. For example, the processing device programs the second plane portion in two passes, a coarse programming pass and a fine programming pass.

At operation 930, the processing device erases or otherwise invalidates the first portion of user data and the second portion of user data associated with the first plane portion and the second plane portion stored in the buffer at operation 915. In some embodiments, the processing device allocates the invalidated decks to the next portions of the first plane and the second plane. In some embodiments, the processing device invalidates the buffer decks in response to completing the second pass of programming for the associated first plane portion and second plane portion.

Figure 10:
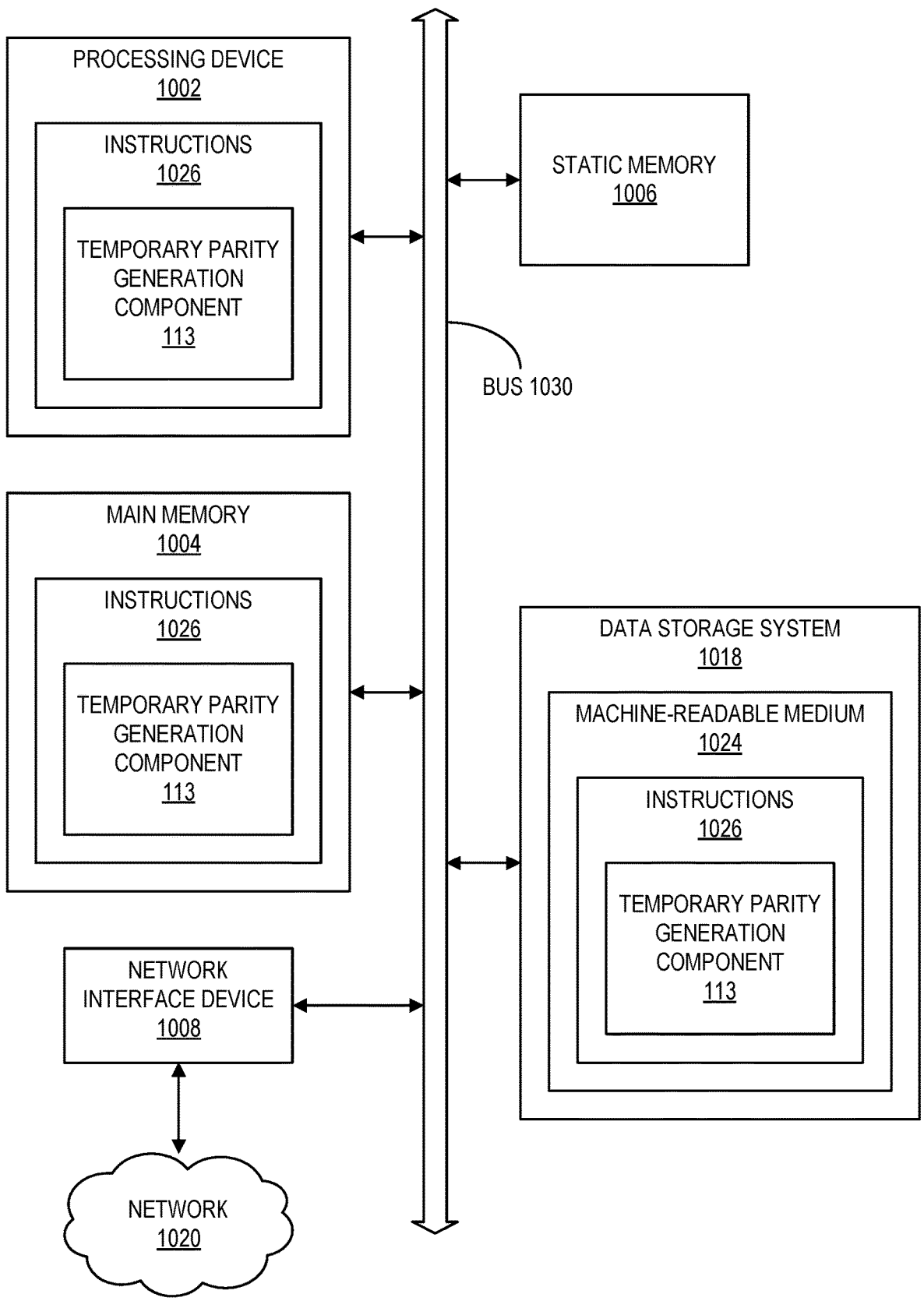
FIG. 10 is a block diagram of an example computer system in which embodiments of the present disclosure may operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the temporary parity generation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 1008 to communicate over the network 1020.

The data storage system 1018 can include a machine-readable storage medium 1024 (also known as a computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory subsystem 110 of FIG. 1.

In one embodiment, the instructions 1026 include instructions to implement functionality corresponding to a temporary parity generation component (e.g., the temporary parity generation component 113 of FIG. 1). While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 800 and 900 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving one or more write commands including user data, wherein the one or more write commands are directed to a portion of memory including a first block and a second block each comprising a plurality of portions and wherein a first portion of the user data is directed to the first block and a second portion of the user data is directed to the second block;
   generating first temporary parity data by performing a parity operation using the first portion of the user data and the second portion of the user data;
   storing the first temporary parity data, the first portion of the user data, and the second portion of the user data in a buffer;
   programming a first portion of the first block with the first portion of the user data, wherein the programming comprises a first pass of programming and a second pass of programming;
   programming a first portion of the second block with the second portion of the user data, wherein the programming comprises a first pass of programming and a second pass of programming; and
   invalidating the first portion and the second portion of the user data in the buffer in response to a completion of the second pass of programming the first portion of the first block and the first portion of the second block, wherein the first temporary parity data is maintained in the buffer until a completion of the second pass of programming the first block and the second block.

2. The method of claim 1, wherein the first block and the second block are a first type of non-volatile memory element and wherein the buffer is a second type of non-volatile memory element.

3. The method of claim 1, wherein a third portion of the user data is directed to the first block and a fourth portion of the user data is directed to the second block, the method further comprising:
   generating second temporary parity data based on the third portion of the user data and the fourth portion of the user data;
   storing the second temporary parity data, the third portion of the user data, and the fourth portion of the user data in the buffer;
   programming a second portion of the first block with the third portion of the user data; and
   programming a second portion of the second block with the fourth portion of the user data.

4. The method of claim 3, wherein the first portion of user data is stored in a first top deck and a first bottom deck of the buffer and wherein the second portion of user data is stored in a second top deck and a second bottom deck of the buffer and wherein invalidating the first portion and the second portion of the user data in the buffer comprises invalidating the first top deck and the second top deck in response to a completion of the first pass of programming the first portion of the first block and the first portion of the second block.

5. The method of claim 3, further comprising:
   scanning the first block and the second block in response to the completion of the second pass of programming the first block and the second block;
   determining whether the first block and the second block contain defects; and
   invalidating the first temporary parity data and the second temporary parity data in response to determining that the first block and the second block do not contain defects.

6. The method of claim 3, further comprising:
   storing transitory pages of the third portion of user data and the fourth portion of user data in a transitory buffer, wherein the transitory pages are pages of the third portion of user data and the fourth portion of user data stored in the transitory buffer before the completion of the second pass of programming the first portion of the first block and the first portion of the second block.

7. The method of claim 1, wherein the first block and the second block are each a plane, together comprising a zone and wherein the parity operation is an exclusive-or operation.

8. A non-transitory computer-readable storage medium comprising instructions that, when executed by a processing device, cause the processing device to:
   receive one or more write commands including user data, wherein the one or more write commands are directed to a portion of memory including a first block and a second block each comprising a plurality of portions and wherein a first portion of the user data is directed to the first block and a second portion of the user data is directed to the second block;
   generate first temporary parity data by performing a parity operation using the first portion of the user data and the second portion of the user data;
   store the first temporary parity data, the first portion of the user data, and the second portion of the user data in a buffer;

program a first portion of the first block with the first portion of the user data, wherein the programming comprises a first pass of programming and a second pass of programming;
program a first portion of the second block with the second portion of the user data, wherein the programming comprises a first pass of programming and a second pass of programming; and
invalidate the first portion and the second portion of the user data in the buffer in response to a completion of the second pass of programming the first portion of the first block and the first portion of the second block, wherein the first temporary parity data is maintained in the buffer until a completion of the second pass of programming the first block and the second block.

9. The non-transitory computer-readable storage medium of claim 8, wherein the first block and the second block are a first type of non-volatile memory element and wherein the buffer is a second type of non-volatile memory element.

10. The non-transitory computer-readable storage medium of claim 8, wherein a third portion of the user data is directed to the first block and a fourth portion of the user data is directed to the second block and wherein the processing device is further to:
generate second temporary parity data based on the third portion of the user data and the fourth portion of the user data;
store the second temporary parity data, the third portion of the user data, and the fourth portion of the user data in the buffer;
program a second portion of the first block with the third portion of the user data; and
program a second portion of the second block with the fourth portion of the user data.

11. The non-transitory computer-readable storage medium of claim 10, wherein the first portion of user data is stored in a first top deck and a first bottom deck of the buffer and wherein the second portion of user data is stored in a second top deck and a second bottom deck of the buffer and wherein invalidating the first portion and the second portion of the user data in the buffer comprises invalidating the first top deck and the second top deck in response to a completion of the first pass of programming the first portion of the first block and the first portion of the second block.

12. The non-transitory computer-readable storage medium of claim 10, wherein the processing device is further to:
scan the first block and the second block in response to the completion of the second pass of programming the first block and the second block;
determine whether the first block and the second block contain defects; and
invalidate the first temporary parity data and the second temporary parity data in response to determining that the first block and the second block do not contain defects.

13. The non-transitory computer-readable storage medium of claim 10, wherein the processing device is further to:
store transitory pages of the third portion of user data and the fourth portion of user data in a transitory buffer, wherein the transitory pages are pages of the third portion of user data and fourth portion of user data stored in the transitory buffer before the completion of the second pass of programming the first portion of the first block and the first portion of the second block.

14. The non-transitory computer-readable storage medium of claim 8, wherein the first block and the second block are each a plane, together comprising a zone and wherein the parity operation is an exclusive-or operation.

15. A system comprising:
a plurality of memory devices; and
a processing device, operatively coupled with the plurality of memory devices, to:
receive one or more write commands including user data, wherein the one or more write commands are directed to a portion of memory including a first block and a second block each comprising a plurality of portions and wherein a first portion of the user data is directed to the first block and a second portion of the user data is directed to the second block, and wherein the first block and the second block are a first type of non-volatile memory element;
generate first temporary parity data by performing a parity operation using the first portion of the user data and the second portion of the user data;
store the first temporary parity data, the first portion of the user data, and the second portion of the user data in a buffer, wherein the buffer is a second type of non-volatile memory element;
program a first portion of the first block with the first portion of the user data, wherein the programming comprises a first pass of programming and a second pass of programming;
program a first portion of the second block with the second portion of the user data, wherein the programming comprises a first pass of programming and a second pass of programming; and
invalidate the first portion and the second portion of the user data in the buffer in response to a completion of the second pass of programming the first portion of the first block and the first portion of the second block, wherein the first temporary parity data is maintained in the buffer until a completion of the second pass of programming the first block and the second block.

16. The system of claim 15, wherein a third portion of the user data is directed to the first block and a fourth portion of the user data is directed to the second block and wherein the processing device is further to:
generate second temporary parity data based on the third portion of the user data and the fourth portion of the user data;
store the second temporary parity data, the third portion of the user data, and the fourth portion of the user data in the buffer;
program a second portion of the first block with the third portion of the user data; and
program a second portion of the second block with the fourth portion of the user data.

17. The system of claim 16, wherein the first portion of user data is stored in a first top deck and a first bottom deck of the buffer and wherein the second portion of user data is stored in a second top deck and a second bottom deck of the buffer and wherein invalidating the first portion and the second portion of the user data in the buffer comprises invalidating the first top deck and the second top deck in response to a completion of the first pass of programming the first portion of the first block and the first portion of the second block.

18. The system of claim 16, wherein the processing device is further to:

scan the first block and the second block in response to the completion of the second pass of programming the first block and the second block;

determine whether the first block and the second block contain defects; and invalidate the first temporary parity data and the second temporary parity data in response to determining that the first block and the second block do not contain defects.

19. The system of claim 16, wherein the processing device is further to:

store transitory pages of the third portion of user data and the fourth portion of user data in a transitory buffer, wherein the transitory pages are pages of the third portion of user data and the fourth portion of user data stored in the transitory buffer before the completion of the second pass of programming the first portion of the first block and the first portion of the second block.

20. The system of claim 15, wherein the first block and the second block are each a plane, together comprising a zone and wherein the parity operation is an exclusive-or operation.

* * * * *